United States Patent
Khan et al.

(10) Patent No.: US 12,200,942 B2
(45) Date of Patent: Jan. 14, 2025

(54) METHODS OF OPERATING FERROELECTRIC (Fe) FET BASED NON-VOLATILE MEMORY CIRCUITS AND RELATED CONTROL CIRCUITS

(71) Applicant: GEORGIA TECH RESEARCH CORPORATION, Atlanta, GA (US)

(72) Inventors: Asif Khan, Atlanta, GA (US); Winston Chern, Cambridge, MA (US); Yuan-Chun Luo, Atlanta, GA (US); Nujhat Tasneem, Atlanta, GA (US); Zheng Wang, Meridian, ID (US); Shimeng Yu, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 213 days.

(21) Appl. No.: 18/063,297

(22) Filed: Dec. 8, 2022

(65) Prior Publication Data
US 2023/0189530 A1  Jun. 15, 2023

Related U.S. Application Data

(60) Provisional application No. 63/287,766, filed on Dec. 9, 2021.

(51) Int. Cl.
H10B 53/00 (2023.01)
H01L 29/51 (2006.01)
(52) U.S. Cl.
CPC ........... *H10B 53/00* (2023.02); *H01L 29/516* (2013.01)
(58) Field of Classification Search
CPC ....... H10B 53/00; H10B 51/30; H01L 29/516; G11C 11/2273; G11C 11/2257; G11C 11/2275; G11C 11/2293; G11C 11/223

(Continued)

(56) References Cited

U.S. PATENT DOCUMENTS 9,830,969 B2 * 11/2017 Slesazeck ............... H10B 53/30
2019/0019801 A1 * 1/2019 Yoo .................... H01L 21/31155
(Continued)

FOREIGN PATENT DOCUMENTS

JP  2007066374 A  *  3/2007

OTHER PUBLICATIONS

Reika Ichihara et al., Re-examination of Vth Window and Reliability in HfO2 FeFET Based on the Direct Extraction of Spontaneous Polarization and Trap Charge during Memory Operation, IEEE 2020 Symposium on VLSI Technology Digest of Technical Papers—TF1.2, 2020, 2 pages.

(Continued)

*Primary Examiner* — Fernando Hidalgo
(74) *Attorney, Agent, or Firm* — Stanek Lemon Crouse & Meeks, P.A.

(57) ABSTRACT

A method of writing data to a Ferroelectric-FET (FeFET) based non-volatile memory device can be provided by applying a voltage pulse at a write voltage level with a write polarity at a gate electrode of a FeFET device with reference to a source electrode of the FeFET device, as a write operation to the FeFET device to establish a state for the FeFET device, changing the voltage pulse, directly after the write operation, to a non-zero bias voltage level with a bias polarity that is opposite to the write polarity, at the gate electrode with reference to the source electrode for a delay time to reduce neutralization of a trap state associated with the write operation of the FeFET device, and changing the voltage pulse, after the delay time, to a read voltage level as a read operation to the FeFET device to determine the state of the FeFET device established during the write operation.

20 Claims, 6 Drawing Sheets

(58) Field of Classification Search
USPC .......................................................... 365/145
See application file for complete search history.

(56) References Cited

U.S. PATENT DOCUMENTS

2022/0148636 A1* 5/2022 Lu ....................... G11C 11/2273
2022/0215870 A1* 7/2022 Jung ................... G11C 11/2259

OTHER PUBLICATIONS

Khan, Asif Islam et al., The future of ferroelectric field-effect transistor technology, Nature Electronics, vol. 3, Oct. 2020, 10 pages.
Ni, Kai et al., Critical Role of Interlayer in Hf0.5Zr0.5O2 Ferroelectric FET Nonvolatile Memory Performance, IEEE Transactions on Electron Devices, vol. 65, No. 6, Jun. 2018, 9 pages.
Sharma, Abhishek A et al., High Speed Memory Operation in Chanel-Last Back-gated Ferroelectric Transistors, IEEE Explore, 2020, 4 pages.
Toprasertpong, K. et al., Direct Observation of Interface Charge Behaviors in FeFET by Quasi-Static Split C—V and Hall Techniques: Revealing FeFET Operation, Department of Electrical Engineering and Information Systems, the University of Tokyo, Tokyo, Japan, IEEE Explore, 2019, 4 pages.

* cited by examiner

METHODS OF OPERATING FERROELECTRIC (Fe) FET BASED NON-VOLATILE MEMORY CIRCUITS AND RELATED CONTROL CIRCUITS

CLAIM FOR PRIORITY

The present Application claims priority to U.S. Provisional Application Ser. No. 63/287,766 entitled Ferroelectric Circuit for Non-Volatile High-Performance Memory, filed in the U.S.P.T.O on Dec. 9, 2021, the entire disclosure of which is hereby incorporated herein by reference.

STATEMENT OF FEDERAL SUPPORT

This invention was made with United States Government support under Award No. HR0011-18-3-0004, awarded by DARPA. The government has certain rights in the invention.

FIELD

The present invention relates to the field of electronics in general, and more particularly, to ferroelectric devices.

BACKGROUND

Ferroelectric field effect transistors (sometimes referred to herein as FeFETs) may be utilized in memory and neuromorphic applications such as non-volatile memory, content addressable memory, and analog synapse in deep learning accelerator, due to its low operation voltages, low energy consumption, ultra-fast write speeds during program and erase, and compact device size. However, FeFETs may have speed limitations due to the requirement for read-after-write delay. This delay is limited by the rate of charge neutralization of interfacial states after polarization of the ferroelectric. The interfacial states can become charged when carriers are captured in trap states screening the polarization of the ferroelectric layer. These charged trap states should be neutralized to ensure that the correct polarization state is read, which can lead to a relatively long delay between writing the device and reading the state of the device.

SUMMARY

Embodiments according to the present invention can provide methods of operating ferroelectric FET based non-volatile memory circuits and related circuits. Pursuant to these embodiments, a method of writing data to a Ferroelectric-FET (FeFET) based non-volatile memory device can be provided by applying a voltage pulse at a write voltage level with a write polarity at a gate electrode of a FeFET device with reference to a source electrode of the FeFET device, as a write operation to the FeFET device to establish a state for the FeFET device, changing the voltage pulse, directly after the write operation, to a non-zero bias voltage level with a bias polarity that is opposite to the write polarity, at the gate electrode with reference to the source electrode for a delay time to reduce neutralization of a trap state associated with the write operation of the FeFET device, and changing the voltage pulse, after the delay time, to a read voltage level as a read operation to the FeFET device to determine the state of the FeFET device established during the write operation.

DETAILED DESCRIPTION OF EMBODIMENTS ACCORDING TO THE INVENTION

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As appreciated by the present inventors, an FeFET device can function as a non-volatile memory device by changing the threshold voltage of the device to represent different states, which can be retained by the device when power is removed. For example, the FeFET device can be placed in a "programmed" state or an "erased" state by establishing a respective threshold voltage by applying a program or erase voltage to switch the polarization of a ferroelectric layer in the device. During polarization switching charges may be trapped in an interfacial layer partially or fully offsetting the polarization. As time passes the charges trapped in the interfacial layer can be neutralized through emission of the carriers or other neutralization events. The polarization is increasingly reflected over time as the trapped carriers screening the polarization charge are neutralized. Accordingly, after writing an FeFET device, a delay time is allotted to allow for the trapped carriers to be sufficiently neutralized before the state of the FeFET device may be correctly read.

As described herein in some embodiments according to the invention, a non-zero bias voltage (i.e., a negative or positive bias relative to 0 volts) can be added (during the delay time) to a voltage pulse train used to program or erase an FeFET to significantly alter the neutralization time constant for traps arising during operation of FeFET devices. In some embodiments, the non-zero bias voltage can have the opposite polarity of the voltage level that is used to program or erase the FeFET device. For example, a negative bias voltage can be applied during the delay time after the FeFET is placed in the programmed state with a positive voltage pulse. In contrast, a positive bias voltage can be applied during the delay time after the FeFET is placed in the erased state using a negative voltage pulse.

The non-zero bias voltage ($V_{delay,PRG}$ and $V_{delay,ERS}$) can be applied across the FeFET gate/source electrodes during the delay time, which occurs directly after completion of the program voltage pulse or the erase voltage pulse and before a read operation is performed to the FeFET. The non-zero bias voltage can reduce the amount of delay needed before the correct state of the FeFET device can be read. This approach may be especially effective for traps as capture and emission times can have an exponential dependence upon surface potential.

Figure 1:
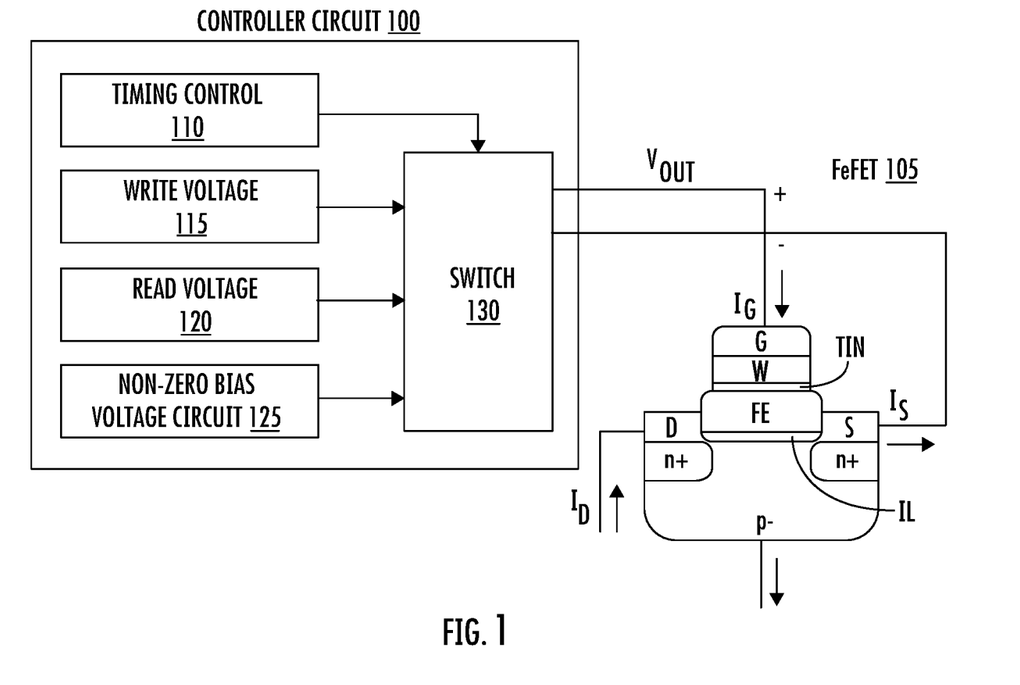
FIG. 1 is a schematic illustration of an FeFET device coupled to a controller circuit that is configured to provide voltage pulses including a non-zero bias voltage level to the FeFET device to establish the programmed state or erased state for the FeFET device in some embodiments according to the invention.

FIG. 1 is a schematic illustration of an FeFET device 105 coupled to a controller circuit 100 that is configured to provide voltage pulses (sometimes referred to herein as a "pulse train") including a non-zero bias voltage level to the FeFET device 105 to the establish the programmed state or the erased state for the FeFET device 105 in some embodiments accord to the invention. According to FIG. 1, the controller circuit 100 can include a write voltage circuit 115 that can provide the voltage levels used for write operations to establish the state of the FeFET device 105. The controller circuit 100 also includes a read voltage circuit 120 that can provide the voltage level used for read operations to determine the state the FeFET device 105.

As shown in FIG. 1, in some embodiments according to the invention, the FeFET device 105 can be an n-type FeFET device having n+ doped source and drain regions formed in a p-type substrate to allow for the formation of an inversion layer IL in the channel region between the source S and drain D regions in response to a voltage applied across the gate-source junction. The gate can include a gate stack including a gate metal G, a tungsten layer W, and a TiN layer on a Ferroelectric layer over the channel region between the source S and drain D regions. Other FeFET device types and structures may also be within the scope of the present invention.

It will be understood that, as used herein, the term "write operation" includes a program operation and an erase operation. In some embodiments according to the invention, the write voltage level for a program operation is a positive voltage level and the write voltage level for an erase operation is a negative voltage level. Furthermore, it will be understood that the voltage levels described herein are provided at the gate electrode of the FeFET device 105 relative to the source electrode of the FeFET device 105.

Accordingly, a program operation can be performed by applying a program voltage level that is positive at the gate electrode relative to the source electrode. Furthermore, an erase operation can be performed by applying an erase voltage level that is negative at the gate electrode relative to the source electrode. It will be understood, therefore, that in some embodiments according to the invention the program and erase voltage levels can be provided at the gate electrode by shifting the reference level at the source electrode.

As further shown in FIG. 1, the controller circuit 100 can include a non-zero bias voltage circuit 125 that is configured to provide a particular non-zero bias voltage level for inclusion in the pulse train for the program operation and for the erase operation. As described herein in some embodiments according to the present invention, the non-zero bias voltage level is used to shift the voltage level provided to the gate electrode of the FeFET device 105 to a value other than 0 volts for a delay time that occurs directly after the write operation is complete. In some embodiments according to the invention, the write operation is complete when the voltage pulse to the FeFET device 105 changes from the write voltage level to a value that is more than or less than a value that is specified to initiate the program or erase operation for the FeFET device 105.

As further shown in FIG. 1, the controller circuit 100 can include a timing control circuit 110 that is configured to control a switch circuit 130 to apply the write voltages, the read voltage, and the non-zero bias voltages to the FeFET device 105 for the times in order to perform program operations, erase operations, and read operations in accordance with embodiments of the present invention.

Figure 2A:
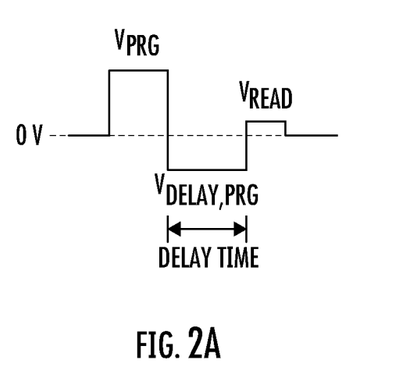
FIGS. 2A and 2B are diagrams illustrating voltage pulse timing and levels including the non-zero bias voltage level for program and erase operations to the FeFET, respectively, device of FIG. 1 in some embodiments according to the invention.
Figure 2B:
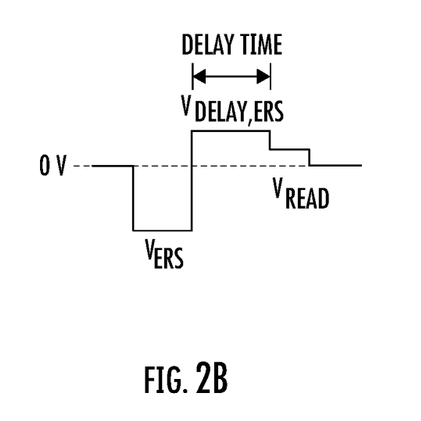

In operation, the timing control circuit 110 operates the switch circuit 130 to provide voltage pulses to the FeFET device 105 as shown in FIGS. 2A and 2B to perform program and erase operations respectively, followed by read operations. As shown in FIG. 2A, a program operation can be performed to the FeFET device 105 by applying a positive voltage pulse from the write voltage circuit 115 at a program voltage level $V_{PRG}$ needed to initiate a program operation for the FeFET device 105. The program voltage level $V_{PRG}$ is maintained by the timing control circuit 110 for a program operation time interval (when $V_{PRG}$ is high) that is specified to perform the program operation.

Directly after the program operation time interval, the timing control circuit 110 switches to a negative bias voltage $V_{DELAY,PRG}$ so that Vout transitions from $V_{PRG}$ to $V_{DELAY,PRG}$. Furthermore, timing control circuit 110 maintains $V_{DELAY,PRG}$ at Vout for a delay time interval before the timing control circuit 110 switches the read voltage circuit 120 to provide $V_{READ}$ as Vout to the FeFET device 105.

As shown in FIG. 2B, an erase operation can be performed to the FeFET device 105 by applying a negative voltage pulse from the write voltage circuit 115 at an erase voltage level $V_{ERS}$ needed to initiate an erase operation as Vout for the FeFET device 105. The erase voltage level $V_{ERS}$ is maintained by the timing control circuit 110 for an erase operation time interval that is specified to perform the erase operation.

Directly after the erase operation time interval, the timing control circuit 110 switches to a positive bias voltage $V_{DELAY,ERS}$ so that Vout transitions from $V_{ERS}$ to $V_{DELAY,ERS}$. Furthermore, timing control circuit 110 maintains $V_{DELAY,ERS}$ at Vout for a delay time interval before the timing control circuit 110 switches the read voltage circuit 120 to provide $V_{READ}$ to Vout.

In some embodiments according to the invention, the delay time occurs when the write voltage level is changed from the write voltage level to begin a delay time that specifies an amount of time that should elapse before the state of the FeFET device 105 can be determined. In some embodiments according to the invention, Vout transitions from $V_{PRG}$ to $V_{DELAY,PRG}$ and/or from $V_{ERS}$ to $V_{DELAY,ERS}$ on a continuous edge. In some embodiments according to the invention, Vout transitions from $V_{PRG}$ to $V_{DELAY,PRG}$ and/or from $V_{ERS}$ to $V_{DELAY,ERS}$ including an intervening time interval at a voltage level that is between $V_{PRG}$ and $V_{DELAY,PRG}$ or between $V_{ERS}$ and $V_{DELAY,ERS}$ before settling at the non-zero bias voltage.

Figure 3:
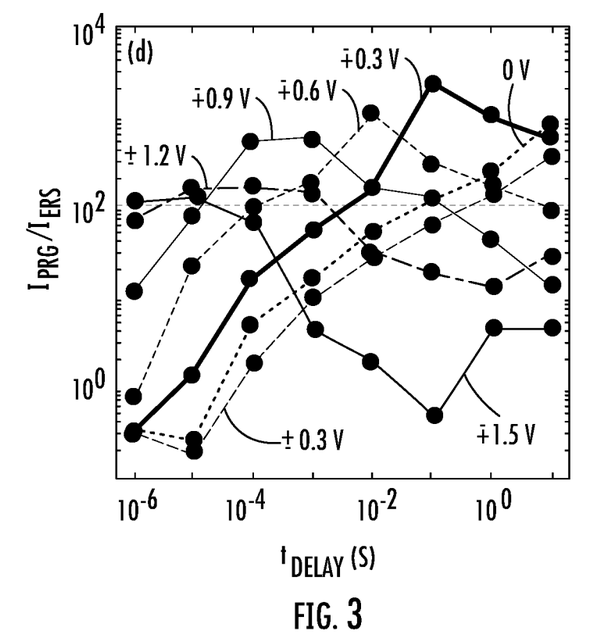
FIG. 3 is a graph illustrating the $t_{delay}$ to achieve $I_{PRG}/I_{ERS}$ of about 100 for different $V_{delay,PRG}/V_{delay,ERS}$ in some embodiments according to the invention.

FIG. 3 is a graph illustrating the $t_{delay}$ to achieve $I_{PRG}/I_{ERS}$ of about 100 for different $V_{delay,PRG}/V_{delay,ERS}$ in some embodiments according to the invention. According to FIG. 3, by applying an increasing non-zero bias voltage having a polarity that is the opposite of the polarity of the signal used for the write operation, the threshold of the $I_{PGM/IERS}$=100 can be achieved in a shorter delay time interval indicating a significant improvement in the neutralization time.

Figure 4:
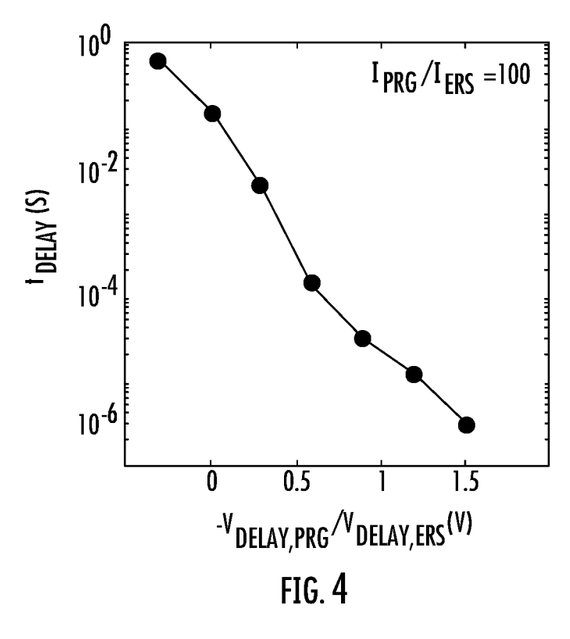
FIG. 4 is a graph illustrating $t_{delay}$ as a function of non-zero bias voltage levels for $V_{delay,PRG}/V_{delay,ERS}$ in some embodiments according to the invention.

FIG. 4 is a graph illustrating $t_{delay}$ for a range of bias voltage levels for $V_{delay,PRG}/V_{delay,ERS}$ in some embodiments according to the invention. In particular, as shown in FIG. 4, the delay time interval for a $I_{PGM}/I_{ERS}$ of about 100 decreases more than 5 orders of magnitude for increasing voltage of the opposite polarity as the program and erase voltages.

Figure 5:
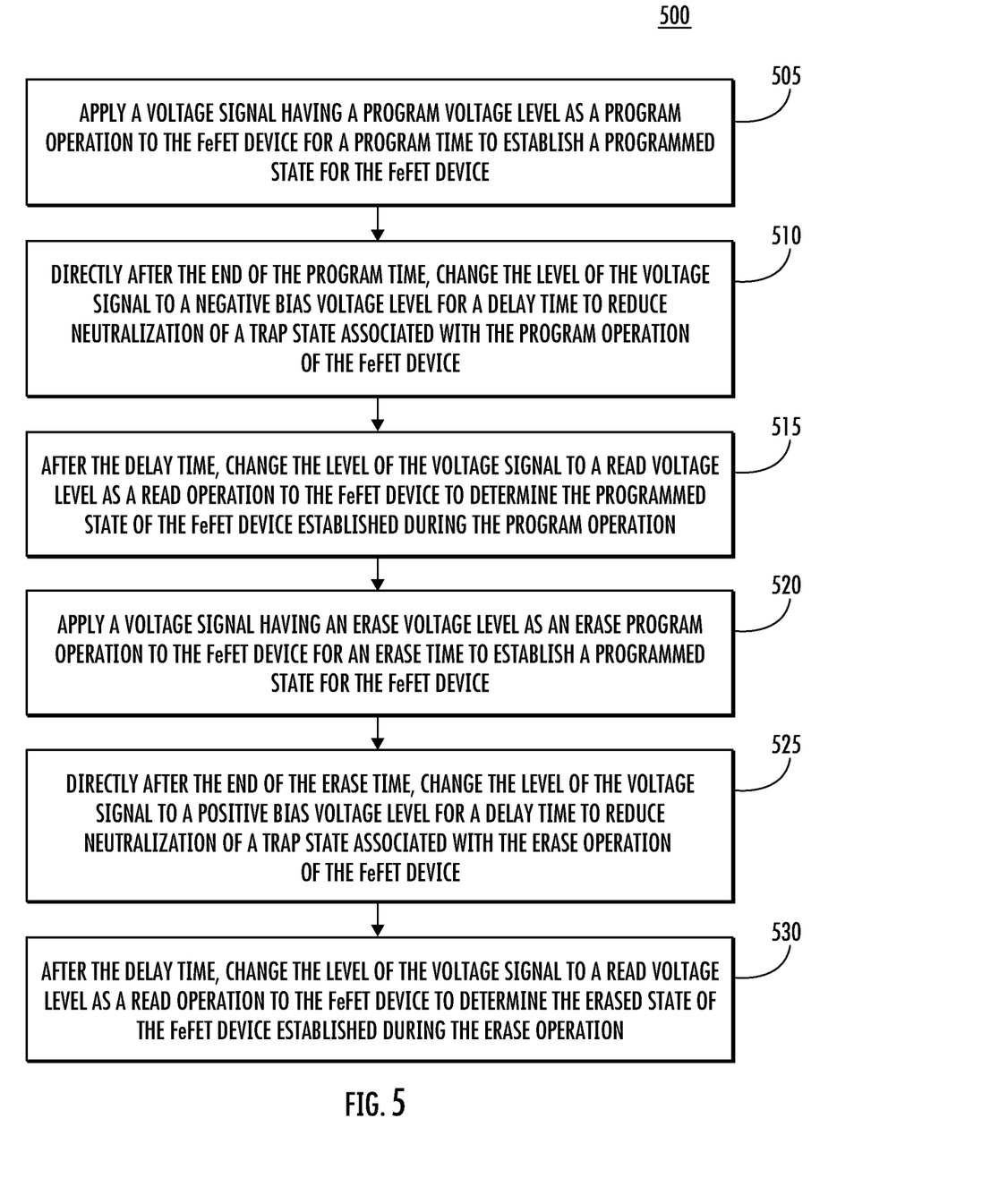
FIG. 5 is a flowchart illustrating operations of the controller circuit of FIG. 1 using a non-zero bias voltage level to the establish the programmed state or the erased state for the FeFET device in some embodiments according to the invention.

FIG. 5 is a flowchart illustrating operations of the controller circuit 100 of FIG. 1 using a non-zero bias voltage level to the establish the programmed state or the erased state for the FeFET device 105 in some embodiments according to the invention. According to FIG. 5, operations of the controller circuit 100 can begin when a program operation voltage is applied to the FeFET device 105 as Vout for a program time to establish a programmed state for the FeFET device (block 505). Directly after the end of the program time, the level of the voltage signal is changed to a negative bias voltage level for a delay time to reduce neutralization of a trap state associated with the program operation of the FeFET device (block 510).

After the delay time, the level of the voltage signal is changed to a read voltage level as a read operation to the FeFET device to determine the programmed state of the FeFET device established during the program operation (block 515). A voltage signal having an erase voltage level as an erase program operation is applied as Vout to the FeFET device 105 for an erase time to establish a programmed state for the FeFET device 1015 (Block 520).

Directly after the end of the erase time, the level of the voltage signal is changed to a positive bias voltage level for a delay time to reduce neutralization of a trap state associated with the erase operation of the FeFET device (block 525). After the delay time, the level of the voltage signal is changed to a read voltage level as a read operation to the FeFET device 105 to determine the erased state of the FeFET device 105 established during the erase operation.

Figure 6:
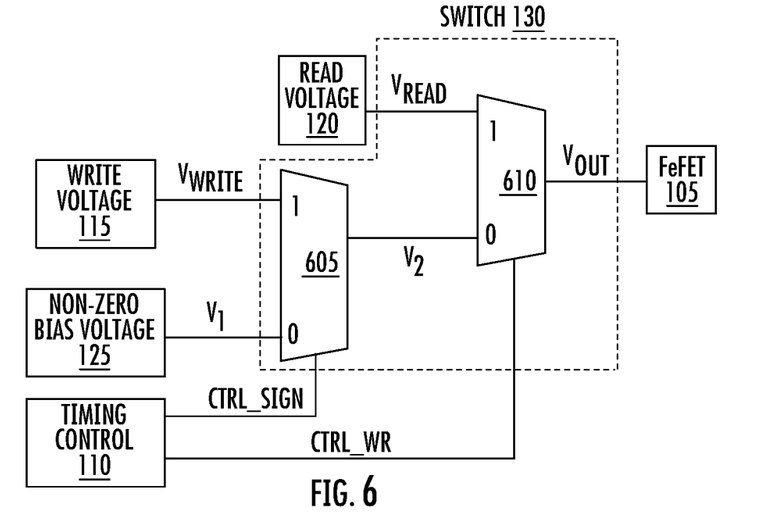
FIG. 6 is a block diagram of the switch circuit included in the controller circuit of FIG. 1 in some embodiments according to the invention.

FIG. 6 is a block diagram of the switch circuit 130 included in the controller circuit 100 operating under control of the timing control circuit 110 of FIG. 1 in some embodiments according to the invention. According to FIG. 6, the switch circuit 130 includes two multiplexers (MUXs) 605 and 610 so that the output voltage (Vout) can be provided by selecting output from then write voltage circuit 115, the non-zero bias voltage circuit 125, and the read voltage circuit 120 through operation of the control signals CTRL_SIGN and CTRL_WR generated by the timing control circuit 110.

Figure 7A:
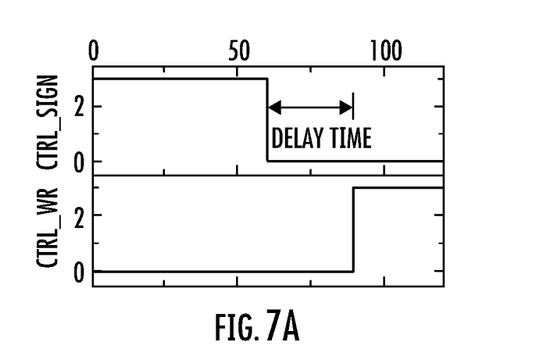
FIG. 7A is a diagram illustrating example timing and voltage levels for control signals generated by the timing control circuit of FIG. 1 in some embodiments accord to the invention.
Figure 7B:
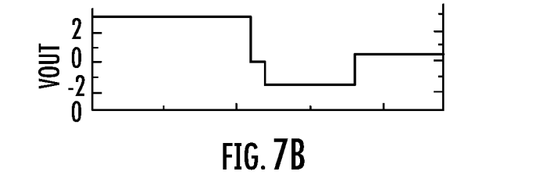
FIG. 7B is a diagram illustrating example timing and voltage levels of $V_{out}$ generated by the switch circuit to the FeFET device of FIG. 1 in some embodiments according to the invention.

FIG. 7A is a diagram illustrating example timing and voltage levels for control signals generated by the timing control circuit of FIG. 1 in some embodiments accord to the invention. FIG. 7B is a diagram illustrating example timing and voltage levels of $V_{out}$ generated by the switch circuit to the FeFET device of FIG. 1 in some embodiments according to the invention.

Figure 8:
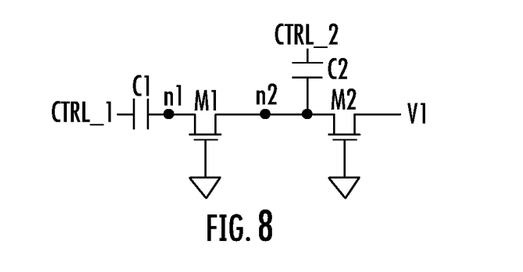
FIG. 8 is a schematic illustration of the non-zero bias voltage circuit of FIG. 1 as a charge pump circuit in some embodiments according to the invention.
Figure 9:
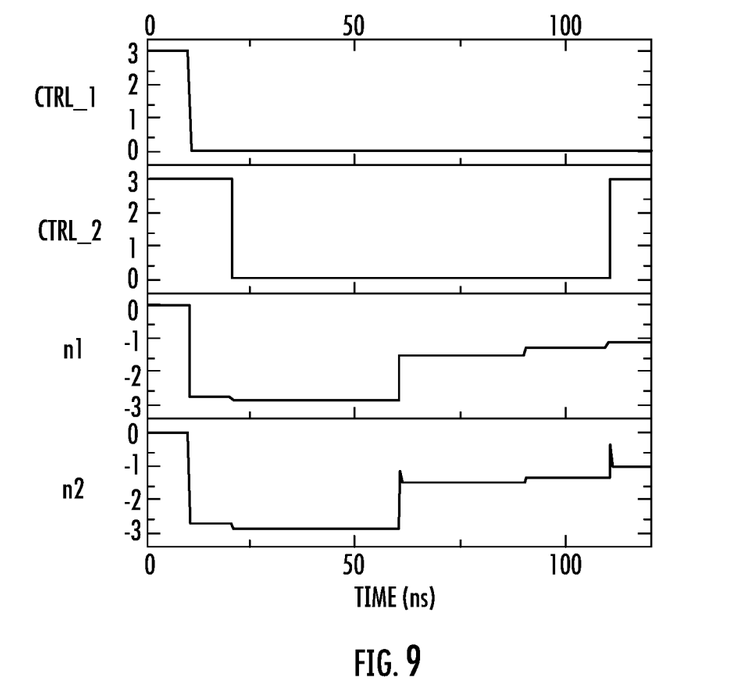
FIG. 9 are diagrams illustrating example timing and voltage levels for operation of the negative charge pump circuit of FIG. 8 in some embodiments according to the invention.
Figure 10:
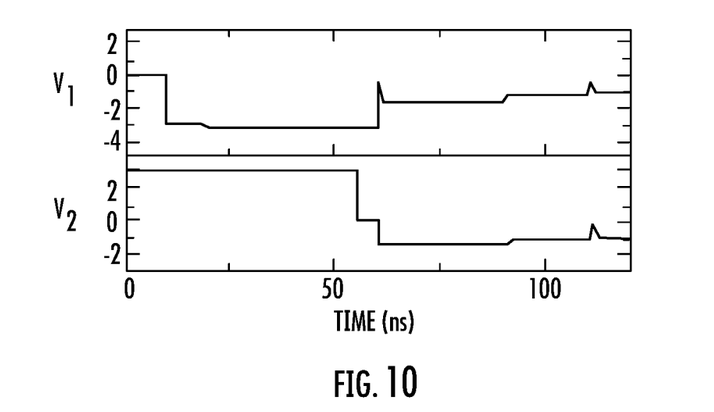
FIG. 10 are diagrams illustrating example timing and voltage levels for V1 and V2 associated with operation of the negative charge pump circuit of FIG. 8 in some embodiments according to the invention.

FIG. 8 is a schematic illustration of the non-zero bias voltage circuit 125 of FIG. 1 as a negative charge pump circuit to provide the non-zero bias voltage level in some embodiments according to the invention. FIG. 9 are diagrams illustrating example timing and voltage levels for operation of the negative charge pump circuit of FIG. 8 in some embodiments according to the invention. FIG. 10 are diagrams illustrating example timing and voltage levels for V1 and V2 associated with operation of the negative charge pump circuit of FIG. 8 in some embodiments according to the invention.

Referring to FIG. 6-10, to perform a write operation, the control signal (CTRL_SIGN) is set to '1' to select write voltage (Vwrite) from the first MUX 605, which is a DC voltage, and write control signal (CTRL_WR) is set to '0' to pass Vwrite through the second MUX 610 to Vout. To apply the bias voltage during the delay time interval, a DC voltage generator, such as the negative charge pump circuit of 8, can be used. According to FIG. 8, a pulse having polarity opposite to that of the write pulse can be generated. In some embodiments according to the present invention, the negative charge pump circuit can include two n-type I/O transistors with deep N-well, M1 and M2 and two coupling capacitors, C1 and C2.

The internal nodes n1 and n2, and the output node (V1) are pre-charged to 0V. The negative hold voltage can be generated by forcing control signal 1 (Ctrl_1) from the pre-charged level VDD to 0V, which subsequently brings n1, n2 and the output voltage of the pump (V1) from 0V to about −VDD. The purpose of C2 is similar to that of C1 but C2 can be used to fine tune the negative hold voltage by the control signal 2 (Ctrl_2). Both control signals (Ctrl_1 and Ctrl_2) are of non-negative voltages and can be provided by the timing control circuit 110. The CTRL_SIGN is set to '0' to select V1 and CTRL_WR is set to '0' to pass V1 through the second MUX 610 to Vout. To perform a read operation, CTRL_WR is set to '1' to pass DC read voltage (Vread) from the read voltage circuit 120, through the second MUX 610 to Vout.

Figure 11:
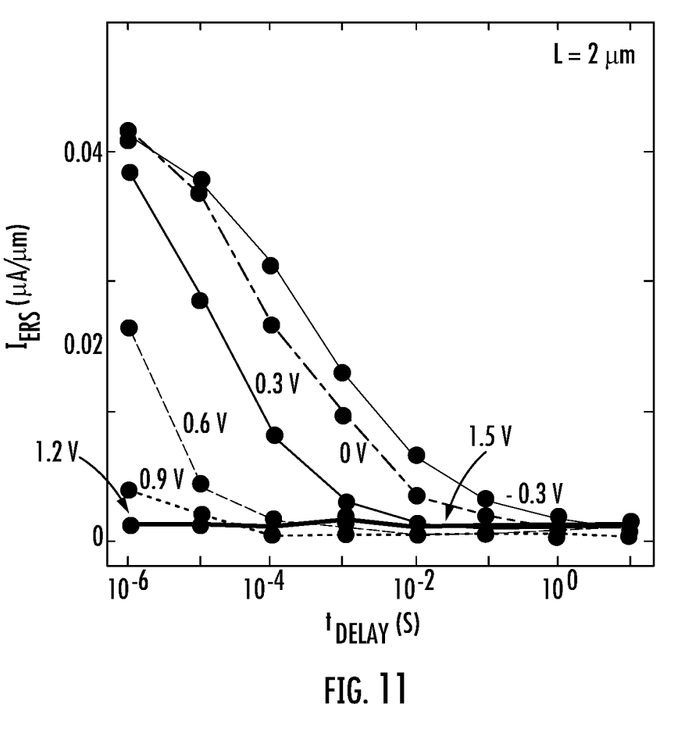
FIG. 11 is a graph illustrating the $I_{ERS}$ as a function to delay time $t_{DELAY}$ to achieve at different non-zero bias voltages in some embodiments according to the invention.

As described herein, by applying negative $V_{delay,PRG}$ directly after a program voltage pulse as shown in FIG. 2A, for example, $I_{PRG}$ can rise faster for a larger negative voltage as a result of faster neutralization of acceptor type states. However, $I_{PGM}$ can begin to reduce due to donor becoming charged as the negative bias point is held for longer periods of time. As shown in FIG. 11, $I_{ERS}$ can be reduced by applying positive $V_{delay,ERS}$ by increasing the neutralization rate for donor states; no increase in $I_{ERS}$ is observed on the linear scale due to the FeFET being in the off-state. With $V_{delay,PRG}$=1.5 V and $V_{delay,ERS}$=1.5 V, IPRG/IERS ratio of 100 can be accomplished with a $t_{delay}$ of −400 ns as shown in FIG. 3. FIG. 4 compares $t_{delay}$ for different $V_{delay,PRG}/V_{delay,ERS}$ combinations, demonstrating that the read after write wait times can be reduced monotonically by applying a negative or positive voltage bias and can be reduced by $10^5$ times using ±1.5 V standby voltages relative to the zero standby voltage scenario, which can make the read after write time sufficient for many applications.

As described herein in some embodiments according to the invention, a non-zero bias voltage (i.e., a negative or positive bias relative to 0 volts) can be added (during the delay time) to a voltage pulse train used to program or erase an FeFET to significantly alter the neutralization time constant for traps arising during operation of FeFET devices. In some embodiments, the non-zero bias voltage can have the opposite polarity of the voltage level that is used to program or erase the FeFET device. For example, a negative bias voltage can be applied during the delay time after the FeFET is placed in the programmed state with a positive voltage pulse. In contrast, a positive bias voltage can be applied during the delay time after the FeFET is placed in the erased state using a negative voltage pulse.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still cooperate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of various embodiments. This description should be read to include one or at least one and the singular also includes the plural unless it is obvious that it is meant otherwise.

It will be appreciated that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present inventive concept. Also, common but well-understood elements that are useful or necessary in a commercially feasible embodiment are often not depicted in order to facilitate a less obstructed view of these various embodiments. The same reference numbers may be used to describe like or similar parts. Further, while several examples have been disclosed herein, any features from any examples may be combined with or replaced by other features from other examples. Moreover, while several examples have been dis-closed herein, changes may be made to the disclosed examples within departing from the scope of the claims.

Those skilled in the art will recognize that a wide variety of modifications, alterations, and combinations can be made with respect to the above described embodiments without departing from the scope of the inventive concept, and that such modifications, alterations, and combinations are to be viewed as being within the ambit of the inventive concept.

The terminology used herein is for the purpose of describing embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

Terms such as "substantially," "about," "approximately" or the like as used in referring to a relationship between two objects is intended to reflect not only an exact relationship but also variances in that relationship that may be due to various factors such as the effects of environmental conditions, common error tolerances, manufacturing variances, or the like. It should further be understood that although some values or other relationships may be expressed herein without a modifier, these values or other relationships may also be exact or may include a degree of variation due to various factors such as the effects of environmental conditions, common error tolerances, manufacturing variances, or the like.

In some embodiments, the term "about" generally refers to a range of numeric values that one of skill in the art would consider equivalent to the recited numeric value or having the same function or result. For example, "about" may refer to a range that is within ±1%, ±2%, ±5%, ±7%, ±10%, ±15%, or even ±20% of the indicated value, depending upon the numeric values that one of skill in the art would consider equivalent to the recited numeric value or having the same function or result. Furthermore, in some embodiments, a numeric value modified by the term "about" may also include a numeric value that is "exactly" the recited numeric value. In addition, any numeric value presented without modification will be appreciated to include numeric values "about" the recited numeric value, as well as include "exactly" the recited numeric value. Similarly, the term "substantially" means largely, but not wholly, the same form, manner or degree and the particular element will have a range of configurations as a person of ordinary skill in the art would consider as having the same function or result. When a particular element is expressed as an ap-proximation by use of the term "substantially," it will be understood that the particular element forms another embodiment.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to im-ply that features, elements and/or steps are in any way required for one or more embodiments or that one or more embodiments necessarily include logic for deciding, with or without user input or prompting, whether these features, elements and/or steps are included or are to be performed in any particular embodiment.

Unless the context clearly requires otherwise, throughout the description and the claims, the words "include," "can include," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the con-text permits, words in the above Detailed Description using the singular or plural number may also include the plural or singular number respectively. The word "or" in reference to a list of two or more items, covers all of the following interpretations of the word: any one of the items in the list, all of the items in the list, and any combination of the items in the list. Likewise the term "and/or" in reference to a list of two or more items, covers all of the following interpretations of the word: any one of the items in the list, all of the items in the list, and any combination of the items in the list.

Disjunctive language such as the phrase "at least one of X, Y, or Z," unless specifically stated otherwise, is otherwise understood with the context as used in general to present that an item, term, etc., may be either X, Y, or Z, or any combination thereof (non-limiting examples: X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the detailed description f has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described elsewhere herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

These and other changes can be made to the invention in light of the detailed description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above detailed description section explicitly de-fines such terms. Accordingly, the actual scope of the invention encompasses not only the dis-closed examples, but also all equivalent ways of practicing or implementing the invention under the claims.

What is claimed:

1. A method of writing data to a Ferroelectric-FET (FeFET) based non-volatile memory device, the method comprising:
    applying a voltage pulse at a write voltage level with a write polarity at a gate electrode of a FeFET device with reference to a source electrode of the FeFET device, as a write operation to the FeFET device to establish a state for the FeFET device;
    changing the voltage pulse, directly after the write operation, to a non-zero bias voltage level with a bias polarity that is opposite to the write polarity, at the gate electrode with reference to the source electrode for a delay time to reduce neutralization of a trap state associated with the write operation of the FeFET device; and
    changing the voltage pulse, after the delay time, to a read voltage level as a read operation to the FeFET device to determine the state of the FeFET device established during the write operation.

2. The method of claim 1 wherein the write polarity is positive to establish a programmed state for the FeFET device and wherein the bias polarity is negative.

3. The method of claim 2 wherein the write voltage level is about 3 Volts.

4. The method of claim 1 wherein the write polarity is negative to establish an erased state for the FeFET device and wherein the bias polarity is positive.

5. The method of claim 4 wherein the write voltage level is about −3 Volts.

6. The method of claim 1 wherein changing the voltage pulse, directly after the write operation, to the non-zero bias voltage level comprises:
    changing the voltage pulse from the write voltage level to the non-zero bias voltage level before beginning the read operation to the FeFET device.

7. The method of claim 1 wherein changing the voltage pulse, directly after the write operation, to the non-zero bias voltage level comprises:
    transitioning the voltage pulse from the write voltage level to the non-zero bias voltage level as a continuous edge of the voltage pulse.

8. The method of claim 1 wherein applying the voltage pulse as the write operation to the FeFET device to establish the state for the FeFET device comprises:
    changing a threshold voltage of the FeFET device to establish a ratio of a drain current in the FeFET device in a programmed state versus in an erased state during the read operation as about 100:1.

9. The method of claim 8 wherein the write polarity is positive to provide a programmed state for the FeFET device, the method further comprising:
changing the voltage pulse, directly after the write operation, to a delay bias voltage in a range between less than 0 V to about −1.5 V.

10. The method of claim 9 wherein the delay bias voltage is applied for the delay time in a range between less than about $10^{-2}$ second to greater than about $10^{-6}$ seconds.

11. The method of claim 8 wherein the write polarity is negative to provide an erased state for the FeFET device, the method further comprising:
changing the voltage pulse, directly after the write operation, to a delay bias voltage in a range between greater than 0 V to about 1.5 V.

12. The method of claim 11 wherein the delay bias voltage is applied for the delay time in a range between less than about $10^{-2}$ second to greater than about $10^{-6}$ seconds.

13. The method of claim 1 wherein changing the voltage pulse, after the delay time, to the read voltage level as the read operation to the FeFET device to determine the state of the FeFET device established during the write operation comprises:
determining the state of the FeFET device established during the write operation based on a level of drain current in the FeFET device.

14. A Ferroelectric-FET (FeFET) device write circuit comprising:
a controller circuit configured to provide a voltage pulse at a write voltage level with a write polarity to a gate electrode of a FeFET device with reference to a source electrode of the FeFET device, as a write operation to the FeFET device to establish a state for the FeFET device;
wherein the controller circuit further configured to switch the voltage pulse, directly after the write operation, from the write voltage level to a non-zero bias voltage level with a bias polarity, that is opposite to the write polarity for a delay time to reduce neutralization of a trap state associated with the write operation of the FeFET device; and
wherein the controller circuit is further configured to switch the voltage pulse, after the delay time, from the non-zero bias voltage level to a read voltage level as a read operation to the FeFET device to determine the state of the FeFET device established during the write operation.

15. The Ferroelectric-FET (FeFET) device write circuit of claim 14 further comprising:
a DC-DC converter circuit configured to provide the non-zero bias voltage level as an output signal configured to couple to the FeFET device for the voltage pulse.

16. The Ferroelectric-FET (FeFET) device write circuit of claim 15 wherein the DC-DC converter circuit comprises a negative charge pump circuit configured to provide the non-zero bias voltage level.

17. The Ferroelectric-FET (FeFET) device write circuit of claim 14 wherein the write polarity is positive to establish a programmed state for the FeFET device and wherein the bias polarity is negative.

18. The Ferroelectric-FET (FeFET) device write circuit of claim 14 wherein the write polarity is negative to establish an erased state for the FeFET device and wherein the bias polarity is positive.

19. The Ferroelectric-FET (FeFET) device write circuit of claim 14 wherein the controller circuit is configured to change the voltage pulse from the write voltage level to the non-zero bias voltage level before beginning the read operation to the FeFET device.

20. Ferroelectric-FET (FeFET) device write circuit of claim 19 wherein the controller circuit is configured to apply a delay bias voltage for the delay time in a range between less than about $10^{-2}$ second to greater than about $10^{-6}$ seconds.

* * * * *